(12) United States Patent
Osakabe

(10) Patent No.: US 7,590,793 B2
(45) Date of Patent: Sep. 15, 2009

(54) DATA ACCESS CONTROLLING METHOD IN FLASH MEMORY AND DATA ACCESS CONTROLLING PROGRAM

(75) Inventor: Takeshi Osakabe, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 207 days.

(21) Appl. No.: 11/060,475

(22) Filed: Feb. 18, 2005

(65) Prior Publication Data

US 2005/0188148 A1    Aug. 25, 2005

(30) Foreign Application Priority Data

Feb. 20, 2004    (JP) ............................. 2004-044474

(51) Int. Cl.
G06F 12/00    (2006.01)
G06F 13/00    (2006.01)
G06F 13/28    (2006.01)
G06F 11/00    (2006.01)

(52) U.S. Cl. .......................... 711/103; 711/100; 714/48

(58) Field of Classification Search .................. 711/103
See application file for complete search history.

(56) References Cited

U.S. PATENT DOCUMENTS

| | | | | |
|---|---|---|---|---|
| 5,748,546 | A * | 5/1998 | Bauer et al. | 365/210.12 |
| 6,236,593 | B1 * | 5/2001 | Hong et al. | 365/185.11 |
| 6,252,800 | B1 * | 6/2001 | Chida | 365/185.11 |
| 6,938,144 | B2 * | 8/2005 | Toyama et al. | 711/206 |
| 6,948,026 | B2 * | 9/2005 | Keays | 711/103 |
| 7,114,117 | B2 * | 9/2006 | Tamura et al. | 714/763 |
| 2004/0170421 | A1 * | 9/2004 | Yoshizawa et al. | 396/310 |

FOREIGN PATENT DOCUMENTS

| | | |
|---|---|---|
| JP | 11-325953 | 11/1999 |
| JP | 2003-015929 | 1/2003 |

* cited by examiner

*Primary Examiner*—Hyung S Sough
*Assistant Examiner*—Gary W Cygiel
(74) *Attorney, Agent, or Firm*—Foley & Lardner LLP

(57) ABSTRACT

An access control method is achieved by providing a flash memory which includes a set of a plurality of blocks, each of which has at least one data area and a flag area. The method is achieved by further referring to flag data written in the flag area of each of the plurality of blocks, to determine whether one of the plurality of blocks is valid, and further reading out data from the block when it is determined based on the flag data that the block is valid.

15 Claims, 10 Drawing Sheets

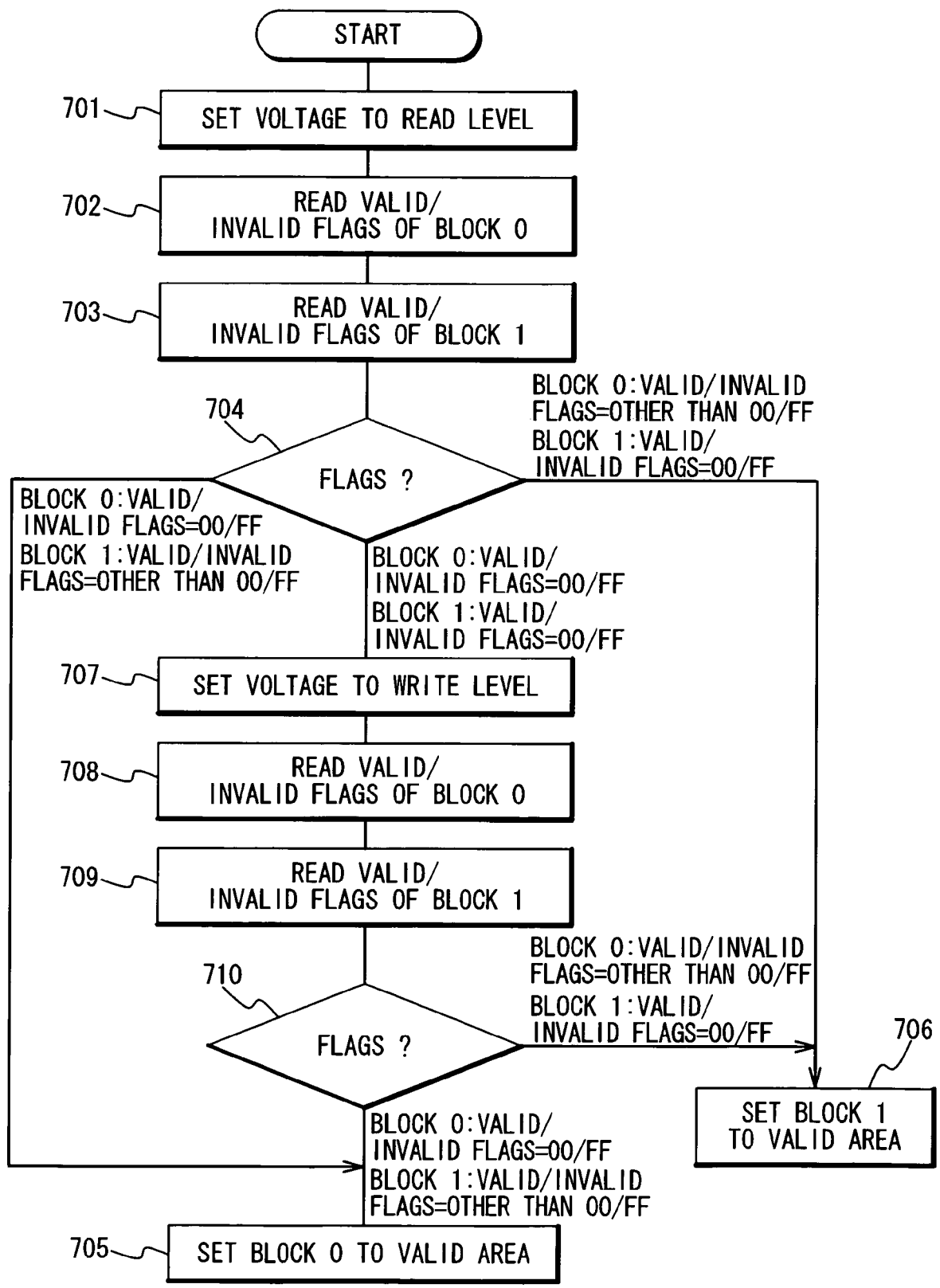

|              | VALID<br>FLAG | INVALID<br>FLAG |                              |
|--------------|---------------|-----------------|------------------------------|
| Fig. 10A     | —×——————      | ——————          | WWV (WRITE VEFIFY LEVEL) (6V) |
| Fig. 10B     | ——————        | ——————          | READ (4V)                    |
| Fig. 10C     | ——————        | —×——————        | EWV (ERASE VERIFY LEVEL) (2V) |

CORRECT

00/FF:READ LEVEL CHECK
00/FF:WWV LEVEL CHECK

|              | VALID<br>FLAG | INVALID<br>FLAG |                              |
|--------------|---------------|-----------------|------------------------------|
| Fig. 11A     | ——————        | ——————          | WWV (WRITE VEFIFY LEVEL) (6V) |
| Fig. 11B     | —○——————      | —○——————        | READ (4V)                    |
| Fig. 11C     | —×——————      | —×——————        | EWV (ERASE VERIFY LEVEL) (2V) |

INCORRECT

00/FF:READ LEVEL CHECK
FF/FF:WWV LEVEL CHECK

DATA ACCESS CONTROLLING METHOD IN FLASH MEMORY AND DATA ACCESS CONTROLLING PROGRAM

BACKGROUND OF THE INVENTION

1. Field of the Invention

The present invention relates to a data processing system and an access control method in a flash memory used in the data processing system.

2. Description of the Related Art

A flash memory is a kind of EEPROM, and data can be newly written by erasing data in units of blocks. Even if power is not supplied to the flash memory, data stored in the flash memory is not lost. For this reason, the flash memory is used for memory cards such as a digital camera and a home game machine, and the storage of BIOS of a personal computer or the like.

With reference to FIGS. A-1 to 1K-2 and FIG. 2, an operation when a data rewriting process through additional data write process by using a plurality of blocks, e.g., two blocks will be briefly described in a conventional flash memory.

FIGS. 1A-1 to 1K-2 are diagrams showing the states when the data rewriting process is carried out by using two blocks 0 and 1 with three data areas 0 to 2 in the conventional flash memory. The data reading process shown in FIG. 2 is carried out under the control of a user application software.

When the data is additionally written in the flash memory, the same data is written in each of the blocks 0 and 1. Herein, the data areas are in the initial state in which an initial value "FFH" is stored in each data area, and the additional write of the data "d1" to "d3" and a data erasing process of the blocks are sequentially carried out. It should be noted that when both the read out data from both the blocks 0 and 1 are the initial value "FFH", or when both the read out data are not coincident with each other, a predetermined default value "d0" is used.

For example, when the data "d1" is written, after the data "d1" is written in the data area 0 of the block 0 as shown in FIG. 1B-1, the data "d1" is written in the data area 0 of the block 1 as shown in FIG. 1C-2. In the state shown in the FIGS. 1C-1 and 1C-2, the data "d1" is read as valid data. The areas of the blocks where data are written are shown by meshes in FIGS. 1A-1 to 1K-2.

When the data rewriting process through the data additional write is carried out by using two blocks (0) and (1) of the conventional flash memory, and the block (0) is full, the same data as that of the block (0) is written in the block (1). Then, the data of the block (0) is erased for writing new data, as shown in FIG. 1H-1 if the block (1) is full.

In the data reading process from the conventional flash memory, as shown in FIG. 2, a read voltage level is firstly set in the conventional flash memory (step 1101). The read voltage level is needed to read out the data from the conventional flash memory by a CPU. Then, the latest data are read out from each of the block 0 and block 1 by using the set read voltage level (steps 1102 and 1103). For example, as shown in FIGS. 1C-1 and 1C-2, the data "d1" stored in the data area 0 of the block 0 and the data "d1" stored in the data area 0 of the block 1 are read out as the latest data.

Subsequently, the data read out from the two blocks are compared (step 1104). When the two data coincide with each other, the read out data are determined to be valid (step 1105). When the two data do not coincide with each other, a predetermined default data "d0" is set as data of the flash memory (step 1106). For example, when the data are read at the timing shown in FIGS. 1C-1 and 1C-2, the data "d1" is determined to be valid since the data "d1" read out from the block 0 and the block 1 coincide with each other.

The default data "d0" is set as valid data at the timing shown in FIG. 1B-1 and 1B-2, since the data read out from the block 0 is the data "d1" and the data read out from the block 1 is the data "FFH", and the data read out from the block 0 and the data read out from the block 1 do not coincide with each other in the comparison of the step 1104. Since the data read out from the block 0 is the data "d2" and the data read out from the block 1 is the data "d1" in FIGS. 1D-1 and 1D-2, the data read out from the block 0 and the data read out from the block 1 do not coincide with each other, and the default data "d0" becomes the valid data. A method of using the last coincidence data instead of the default data may be adopted in case of data incoincidence.

FIGS. 1A-1 to 1K-2 and FIG. 2 show a case where the coincidence determination of the read data is carried out by using the two blocks. Also, a method for determining the valid data by the majority decision of the latest data read out from three blocks is known in a data rewriting process using three blocks. For example, the method of determining the valid data by the majority decision is disclosed in Japanese Laid Open Patent Application (JP-A-Heisei 11-325953).

However, various problems described below exist in the above-described data access control method in the conventional flash memory.

When the data rewriting process is interrupted at timing t during the additional data write into the data area 0 of the block 1 due to a cause such as a power fault in the conventional flash memory, as shown in FIGS. 1B-1 and 1B-2, there would be a possibility that the coincidence of the data between the two blocks is diminished, so that the latest data cannot be used.

The reason is that it is impossible to determine whether the data of either block is valid. Therefore, the default data is used as a valid data. When the process is interrupted due to the power fault at the timing shown by "t" in FIGS. 1A-1 to 1K-2, it is determined that data are not coincident with each other and the latest data is not held, even if the latest data is actually stored in the block. Since it is necessary to erase the data when the data areas of the block have been fully used through the data rewrite, the valid data cannot be determined in a state where one of the blocks is erased, in the same manner as the above procedure.

When the valid data is determined based on the majority decision by using three or more blocks as disclosed in Japanese Laid Open Patent Application (JP-A-Heisei 11-325953), the validity of the data of each block cannot be guaranteed when the data rewriting process is interrupted due to the cause such as the power fault. Therefore, there would be a possibility that the valid data cannot be accurately determined. Also, when a method for determining the valid data is carried out based on the majority decision by using three or more blocks, the data area has large waste since the same data is written in multiple blocks.

SUMMARY OF THE INVENTION

In an aspect of the present invention, an access control method is achieved by providing a flash memory, which comprises a set of a plurality of blocks, each of which has at least one data area and a flag area; by referring to flag data written in the flag area of each of the plurality of blocks, to determine whether one of the plurality of blocks is valid; and by reading out data from the block when it is determined based on the flag data that the block is valid.

Here, when the flag area comprises a valid flag area and an invalid flag area, the referring step may be achieved by reading out the flag data from the valid flag area and the invalid flag area in each of the plurality of blocks; and by carrying out a first determination of whether the block is valid, based on the read out flag data from the valid and invalid flag areas in each of the plurality of blocks.

In this case, when the plurality of blocks are first and second blocks, the step of carrying out a first determination may be achieved by determining that the first block is valid when valid data as the flag data is written in the valid flag area of the first block or invalid data as the flag data is not written in the invalid flag area of the first block; and by determining that the second block is valid when the valid data is written in the valid flag area of the second block and the invalid data is not written in the invalid flag area of the second block.

Instead, when the plurality of blocks are first and second blocks, the step of carrying out a first determination may be achieved by determining that the first block is valid when valid data as the flag data is written in the valid flag area of the first block and invalid data as the flag data is not written in the invalid flag area of the first block and when the valid data is not written in the valid flag area of the second block or the invalid data is written in the invalid flag area of the second block; and by determining that the second block is valid when the valid data is not written in the valid flag area of the first block or the invalid data is written in the invalid flag area of the first block and when the valid data is written in the valid flag area of the second block and the invalid data is written in the invalid flag area of the second block.

In this case, the access control method may be achieved by further including a step of setting a voltage for the flash memory to a read voltage level before the step of reading out the data from the valid and invalid flag areas. In this case, the access control method may be achieved by further including steps of setting the voltage for the flash memory to a write voltage level, when the valid data is written in the valid flag area of the first block and the invalid data is not written in the invalid flag area of the first block and when the valid data is written in the valid flag area of the second block and the invalid data is not written in the invalid flag area of the second block; reading out the flag data from the valid and invalid flag areas in each of the plurality of blocks, after the step of setting the voltage for the flash memory to the write voltage level; and carrying out a second determination of whether the first block or the second block is valid, based on the read out flag data from the valid and invalid flag areas in each of the plurality of blocks.

In this case, the step of carrying out a second determination may be achieved by determining that the first block is valid when the valid data is written in the valid flag area of the first block and the invalid data is not written in the invalid flag area of the first block and when the valid data is not written in the valid flag area of the second block or the invalid data is written in the invalid flag area of the second block; and by determining that the second block is valid when the valid data is not written in the valid flag area of the first block or the invalid data is written in the invalid flag area of the first block and when the valid data is written in the valid flag area of the second block and the invalid data is written in the invalid flag area of the second block.

Also, the access control method may be achieved by further including the steps of writing the data in the block; writing the valid data as the flag data in the valid flag area of the block; and writing invalid data as the flag data in the invalid flag area of each of the plurality of blocks other than the block.

In another aspect of the present invention, a computer system include a flash memory, a RAM section, and a CPU. The flash memory includes a plurality of blocks and a program area, each of the plurality of blocks comprising at least one data area configured to store data, a valid flag area configured to store valid data as flag data and an invalid flag area configured to store invalid data as the flag data, and the program area configured to store an access control program. The CPU reads out the access control program from the flash memory, stores the access control program in the RAM section, and executes the access control program. Based on the access control program in response to a read request, the CPU refers to the flag data in the valid and invalid flag areas of each of the plurality of blocks, to determine whether one of the plurality of blocks is valid, and reads out the data from the block when it is determined based on the flag data that the block is valid.

Here, the CPU may read out the flag data from the valid flag area and the invalid flag area in each of the plurality of blocks, and may carry out a first determination of whether the block is valid, based on the read out flag data from the valid and invalid flag areas in each of the plurality of blocks.

Also, when the plurality of blocks are first and second blocks, the CPU determines that the first block is valid when valid data as the flag data is written in the valid flag area of the first block or invalid data as the flag data is not written in the invalid flag area of the first block, and determines that the second block is valid when the valid data is written in the valid flag area of the second block and the invalid data is not written in the invalid flag area of the second block, as the first determination.

Also, when the plurality of blocks are first and second blocks, the CPU determines that the first block is valid when valid data as the flag data is written in the valid flag area of the first block and invalid data as the flag data is not written in the invalid flag area of the first block and when the valid data is not written in the valid flag area of the second block or the invalid data is written in the invalid flag area of the second block, and determines that the second block is valid when the valid data is not written in the valid flag area of the first block or the invalid data is written in the invalid flag area of the first block and when the valid data is written in the valid flag area of the second block and the invalid data is written in the invalid flag area of the second block, as the first determination.

Also, when the flash memory further includes a control macro section, the CPU may control the control macro section to set a voltage for the flash memory to a read voltage level before the step of reading out the data from the valid and invalid flag areas.

Also, when the flash memory further includes a control macro section, the CPU controls the control macro section to set the voltage for the flash memory to a write voltage level, when the valid data is written in the valid flag area of the first block and the invalid data is not written in the invalid flag area of the first block and when the valid data is written in the valid flag area of the second block and the invalid data is not written in the invalid flag area of the second block, and the CPU reads out the flag data from the valid and invalid flag areas in each of the plurality of blocks, after the step of setting the voltage for the flash memory to the write voltage level, and carries out a second determination of whether the first block or the second block is valid, based on the read out flag data from the valid and invalid flag areas in each of the plurality of blocks.

In this case, the CPU may determine that the first block is valid when the valid data is written in the valid flag area of the first block and the invalid data is not written in the invalid flag area of the first block and when the valid data is not written in the valid flag area of the second block or the invalid data is written in the invalid flag area of the second block, and may determine that the second block is valid when the valid data is not written in the valid flag area of the first block or the invalid data is written in the invalid flag area of the first block and when the valid data is written in the valid flag area of the second block and the invalid data is written in the invalid flag area of the second block, as the second determination.

Also, the CPU may write the data in the block, writes the valid data as the flag data in the valid flag area of the block, and writing invalid data as the flag data in the invalid flag area of each of the plurality of blocks other than the block.

Also, in another aspect of the present invention, a computer executable software product realizes the functions of: referring to flag data written in flag area of each of the plurality of blocks to determine whether one of a plurality of blocks is valid, wherein a flash memory, which comprises a set of the plurality of blocks, each of which has at least one data area and the flag area; and reading out data from the block when it is determined based on the flag data that the block is valid.

Also, when the flag area comprises a valid flag area and an invalid flag area, the function of referring comprises the functions of: reading out the flag data from the valid flag area and the invalid flag area in each of the plurality of blocks; and carrying out a first determination of whether the block is valid, based on the read out flag data from the valid and invalid flag areas in each of the plurality of blocks.

Also, when the plurality of blocks are first and second blocks, the function of carrying out a first determination may include determining that the first block is valid when valid data as the flag data is written in the valid flag area of the first block and invalid data as the flag data is not written in the invalid flag area of the first block and when the valid data is not written in the valid flag area of the second block or the invalid data is written in the invalid flag area of the second block; and determining that the second block is valid when the valid data is not written in the valid flag area of the first block or the invalid data is written in the invalid flag area of the first block and when the valid data is written in the valid flag area of the second block and the invalid data is written in the invalid flag area of the second block.

In this case, the computer executable software product may realize the functions: setting a voltage for the flash memory to a read voltage level before reading out the data from the valid and invalid flag areas; setting the voltage for the flash memory to a write voltage level, when the valid data is written in the valid flag area of the first block and the invalid data is not written in the invalid flag area of the first block and when the valid data is written in the valid flag area of the second block and the invalid data is not written in the invalid flag area of the second block; reading out the flag data from the valid and invalid flag areas in each of the plurality of blocks, after the step of setting the voltage for the flash memory to the write voltage level; determining that the first block is valid when the valid data is written in the valid flag area of the first block and the invalid data is not written in the invalid flag area of the first block and when the valid data is not written in the valid flag area of the second block or the invalid data is written in the invalid flag area of the second block; and determining that the second block is valid when the valid data is not written in the valid flag area of the first block or the invalid data is written in the invalid flag area of the first block and when the valid data is written in the valid flag area of the second block and the invalid data is written in the invalid flag area of the second block.

Also, the computer executable software product may realize the functions of: writing the data in the block; writing the valid data as the flag data in the valid flag area of the block; and writing invalid data as the flag data in the invalid flag area of each of the plurality of blocks other than the block.

BRIEF DESCRIPTION OF THE DRAWINGS

FIGS. 1A-1 to 1K-2 are diagrams showing the states when data are rewritten by using two blocks in a conventional flash memory;

FIG. 2 is a flow chart showing a determining process of read-out data in the conventional flash memory;

FIGS. 6A-1 to 6K-2 are diagrams showing the state when data is rewritten by using two blocks of the flash memory according to the first embodiment of the present invention;

FIG. 9 is a flow chart showing the determining process of valid/invalid data read-out of in the flash memory according to a second embodiment of the present invention;

FIGS. 10A to 10C are diagrams showing a relationship between voltage levels of valid/invalid flags, and voltage levels of read, write and erasure processes in the flash memory; and FIGS. 11A to 11C are diagrams showing a relationship between voltage levels of valid/invalid flags, and voltage levels of read, write and erasure processes in the flash memory.

DESCRIPTION OF THE PREFERRED EMBODIMENTS

Hereinafter, a data processing system as a computer system of the present invention will be described in detail with reference to the attached drawings.

Figure 3:
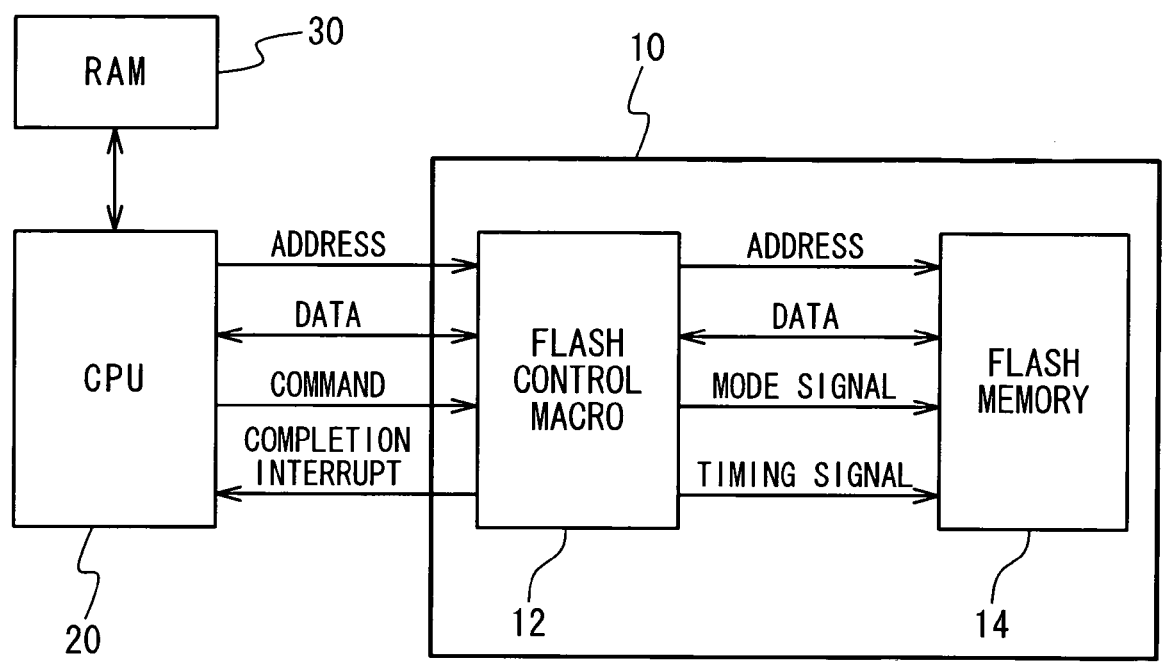
FIG. 3 is a block diagram showing a hardware configuration of a data processing system to which a data access control method is applied, in a flash memory according to the present invention.

FIG. 3 is a block diagram showing a hardware configuration of the data processing system to which the present invention is applied. The data processing system includes a flash memory 10, a CPU 20 and a RAM 30 which are mutually connected by a system bus.

The CPU 20 controls the flash memory 10 by using an address signal, a data signal, and a command signal. The flash memory 10 stores a data access control program to be executed by the CPU 20 and data. When a data rewriting process of the flash memory 10 is carried out, the above program is sent from the flash memory 10 to the RAM 30, and is stored in the RAM 30. Also, when the CPU 20 executes the data access control program, the CPU 20 reads out it from the flash memory 10, and stores it in the RAM 30.

The data rewriting process to the flash memory 10 is carried out by the CPU 20 through the following processing procedures.

(a) A data access control program 100 is read from the flash memory 10 and is sent to the RAM 30 by the CPU 20.

(b) A switching from a program on the flash memory 10 to a program on the RAM 30 is carried out.
(c) A write address signal, a data signal and a write command signal are output from the CPU 20 to the flash memory 10.
(d) The flash memory 10 writes data in the write address in response to the write command signal from the CPU 20.
(e) When the data are completely written (or erased), a completion interrupt is output from the flash memory 10 to the CPU 20.

Through the above procedures, the write or erasure of data is carried out to each block of the flash memory 10. The data reading process carried out to the flash memory 10 by the CPU 20 based on the data access control program 100 will be described later.

First Embodiment

Figure 4:
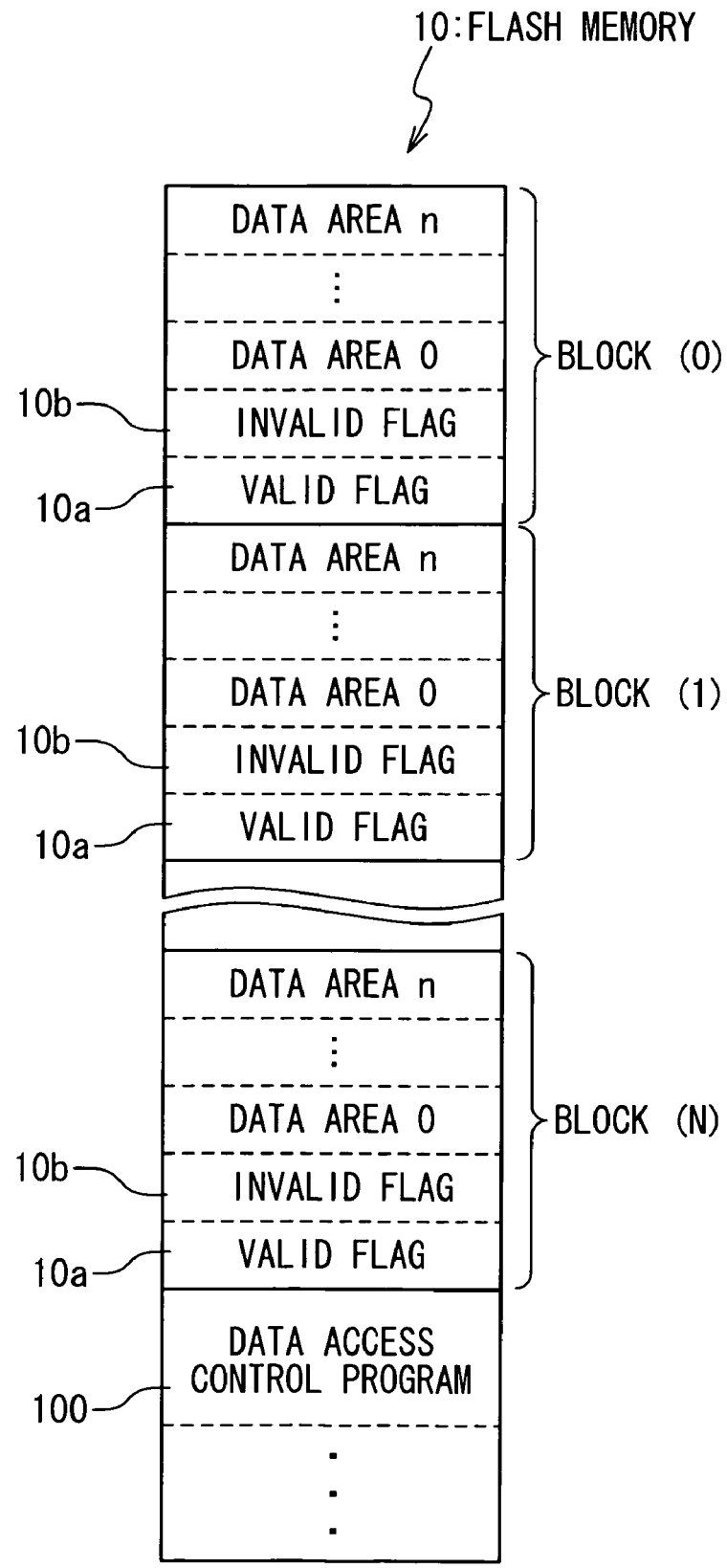
FIG. 4 is a diagram showing a hardware configuration of a flash memory according to a first embodiment of the present invention.

FIG. 4 is a diagram showing the configuration of the flash memory 10 in the first embodiment of the present invention. As shown in FIG. 4, the flash memory 10 in the first embodiment includes multiple blocks (0), (1) to (N), and rewrite of data is carried out using every two of these blocks. In FIG. 4, the erasing process is carried out by writing same specific data in the blocks (0) and (1).

The data access control program 100 for the data rewriting process into the flash memory 10 is stored in a portion of the flash memory 10. The data access control program 100 is executed by the CPU 20, and the data rewriting process into the flash memory 10 is carried out under the control of the CPU 20.

As shown in FIG. 4, each of the blocks (0) to (N) of the flash memory 10 in the first embodiment has a plurality of data areas 0 to n (n is a natural number of 1 or more), and has a valid flag area where a valid flag 10*a* is written and an invalid flag area where an invalid flag 10*b* is written. The valid flag 10*a* and the invalid flag 10*b* are flag data for indicating whether the data area, or written data in the block is valid or not. When the data area is valid, the value "00H" is written as the valid flag 10*a*. When the data area is invalid, the value "00H" is written as the invalid flag 10*b*. The value to be written may be optionally set if the validity and the invalidity can be distinguished.

Figure 5:
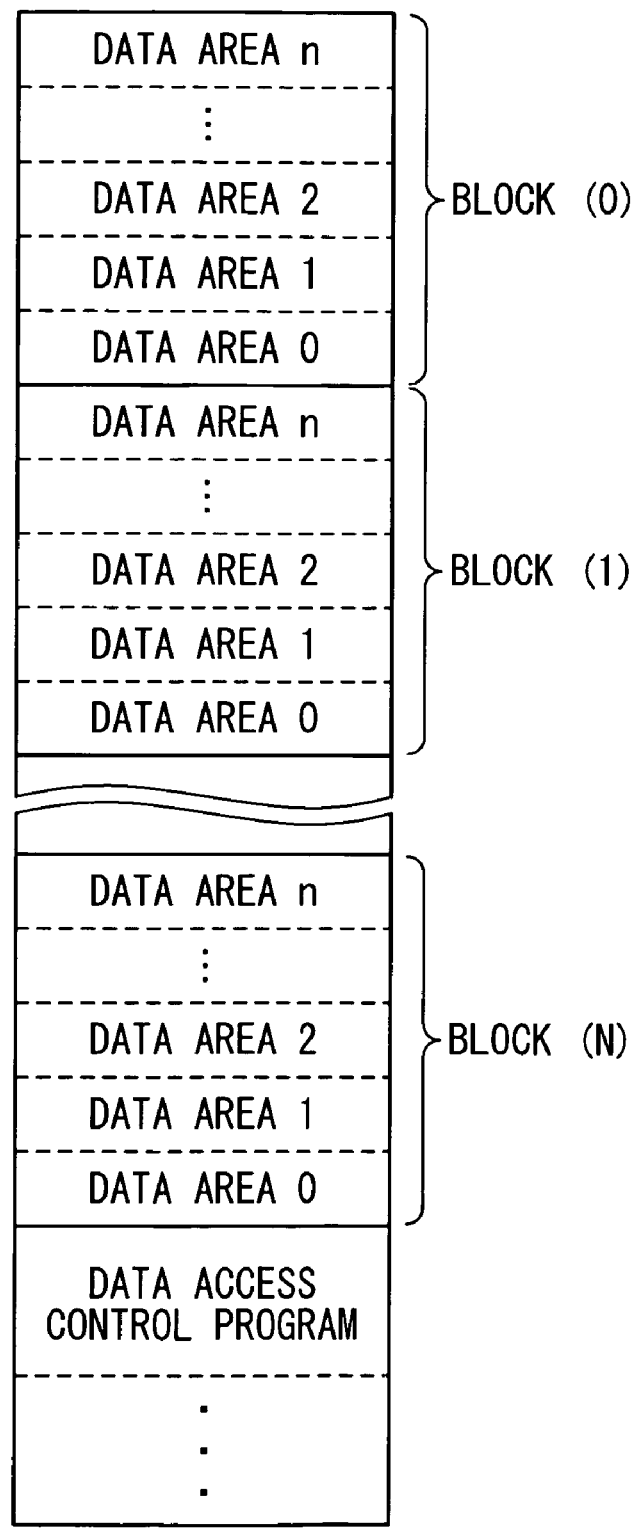
FIG. 5 is a diagram showing a hardware configuration of the conventional flash memory.

FIG. 5 is a diagram showing the configuration of the above conventional flash memory. The conventional flash memory has many blocks like the flash memory of the first embodiment, but each block has only a plurality of data areas 0 to in and does not have valid/invalid flag areas.

Next, the data rewriting process into the flash memory and a data determining process in a data reading process in the first embodiment will be described.

FIGS. 6A-1 to 6K-2 are diagrams showing the data rewriting process using the two blocks (0) and (1) of the flash memory 10, for example. Here, it is supposed that each of the blocks (0) and (1) has one data area, the valid flag area for the valid flag 10*a* and the invalid flag area for the invalid flag 10*b*.

In an initial state, data "FFH" is stored as an initial value in the data areas of the blocks (0) and (1) of the flash memory 10, the valid flag areas for the valid flags 10*a* and the invalid flag areas for the invalid flags 10*b*. A case where the data write process and the data erasing process are sequentially carried out will be described from the initial state.

Figure 7:
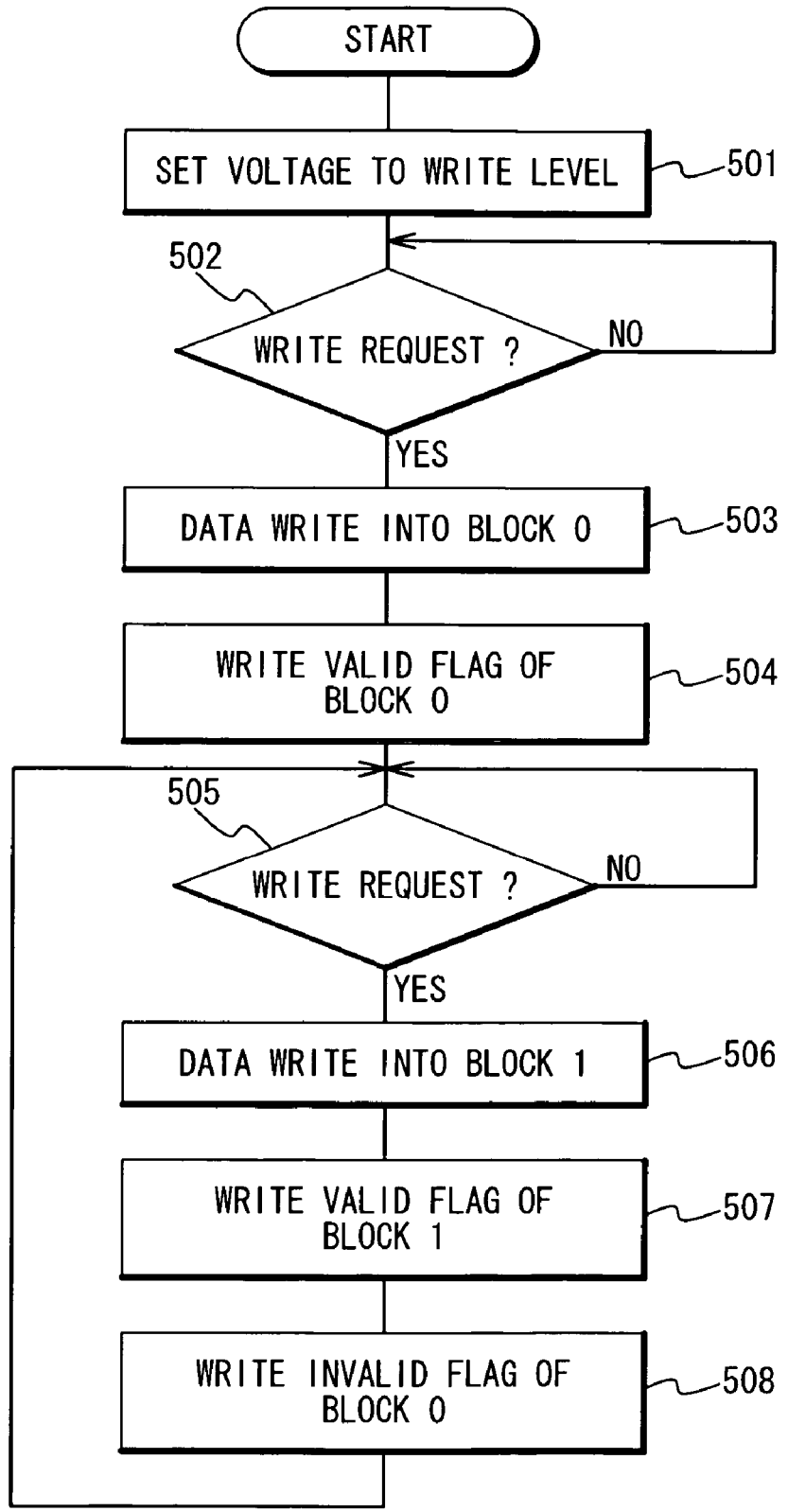
FIG. 7 is a flow chart showing a data rewriting process using two blocks in the flash memory according to the first embodiment of the present invention.

FIG. 7 is a flow chart showing the data rewriting process. Firstly, the data access control program 100 is executed by the CPU 20 and a write voltage level is set (step 501).

Figure 1:
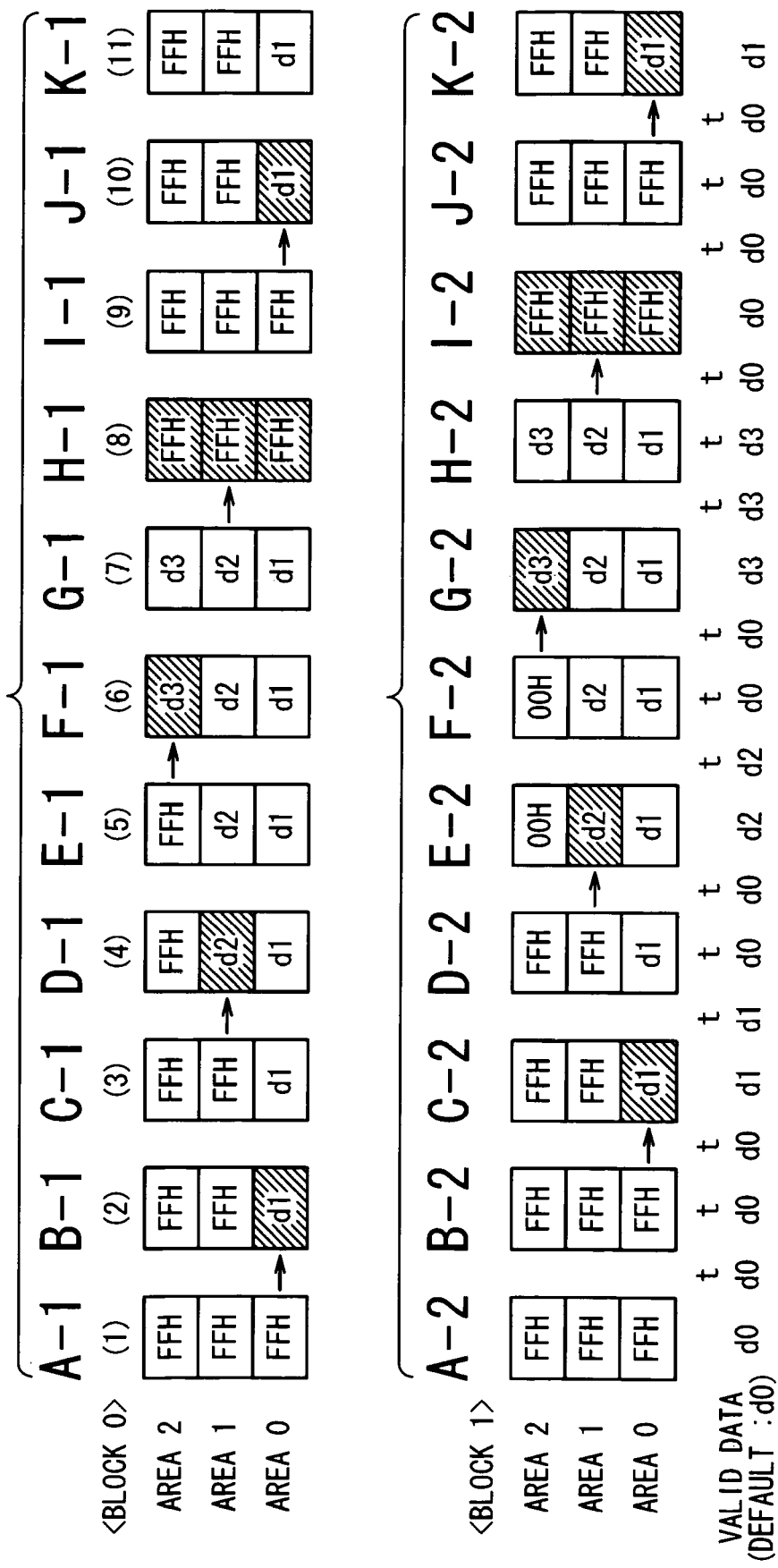
Figure 6:
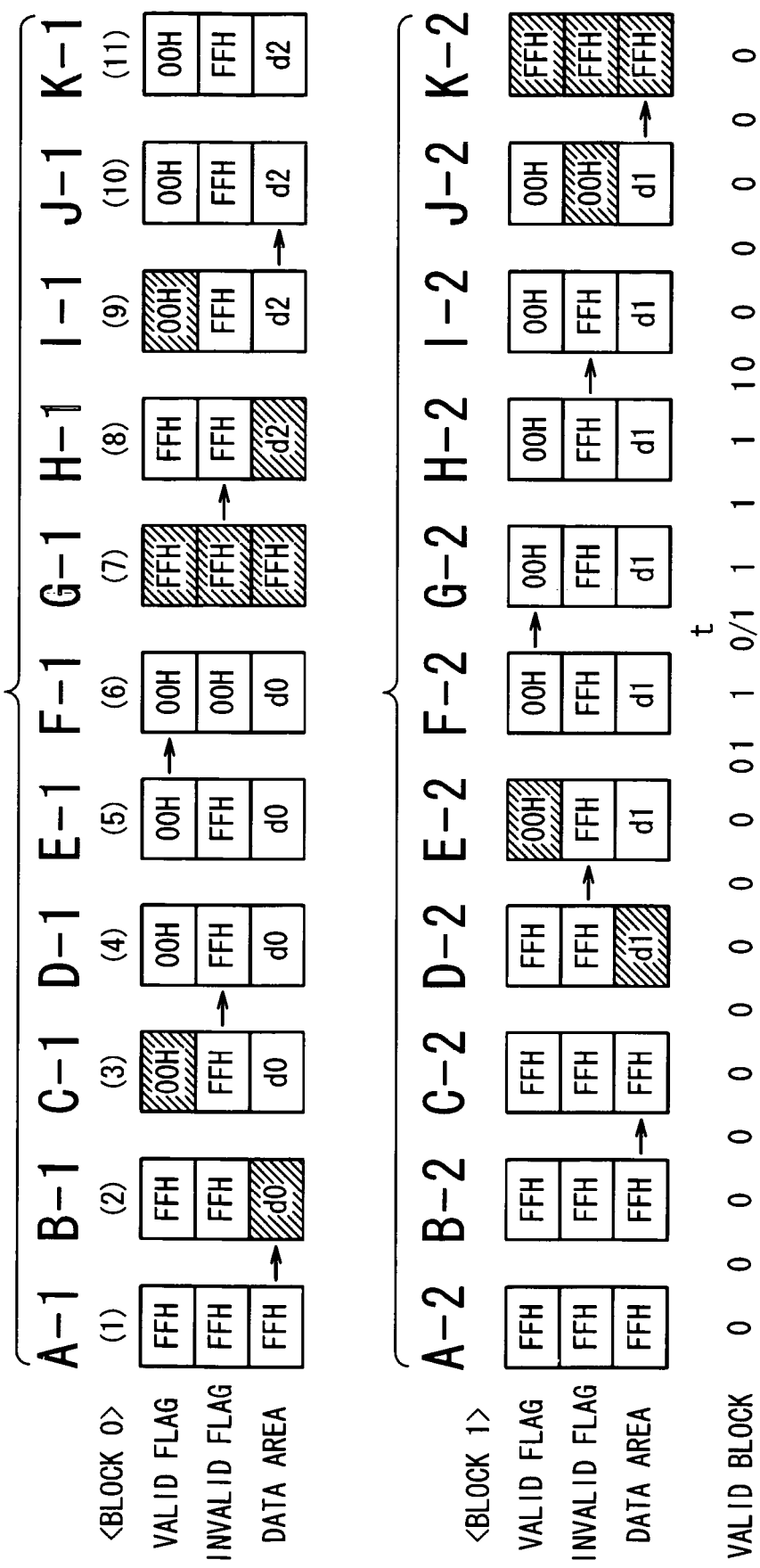

Subsequently, when the data write command is outputted for the data area of the block (0) in the initial state shown in FIGS. 6A-1 and 6A-2 (step 502), data "d0" is written in the block (0) as shown in FIGS. 6B-1 (step 503).

Subsequently, the value "00H" is written as the valid flag 10*a* of the block (0) to indicate that the data is valid, as shown in FIG. 6C-1 (step 504).

Figure 2:
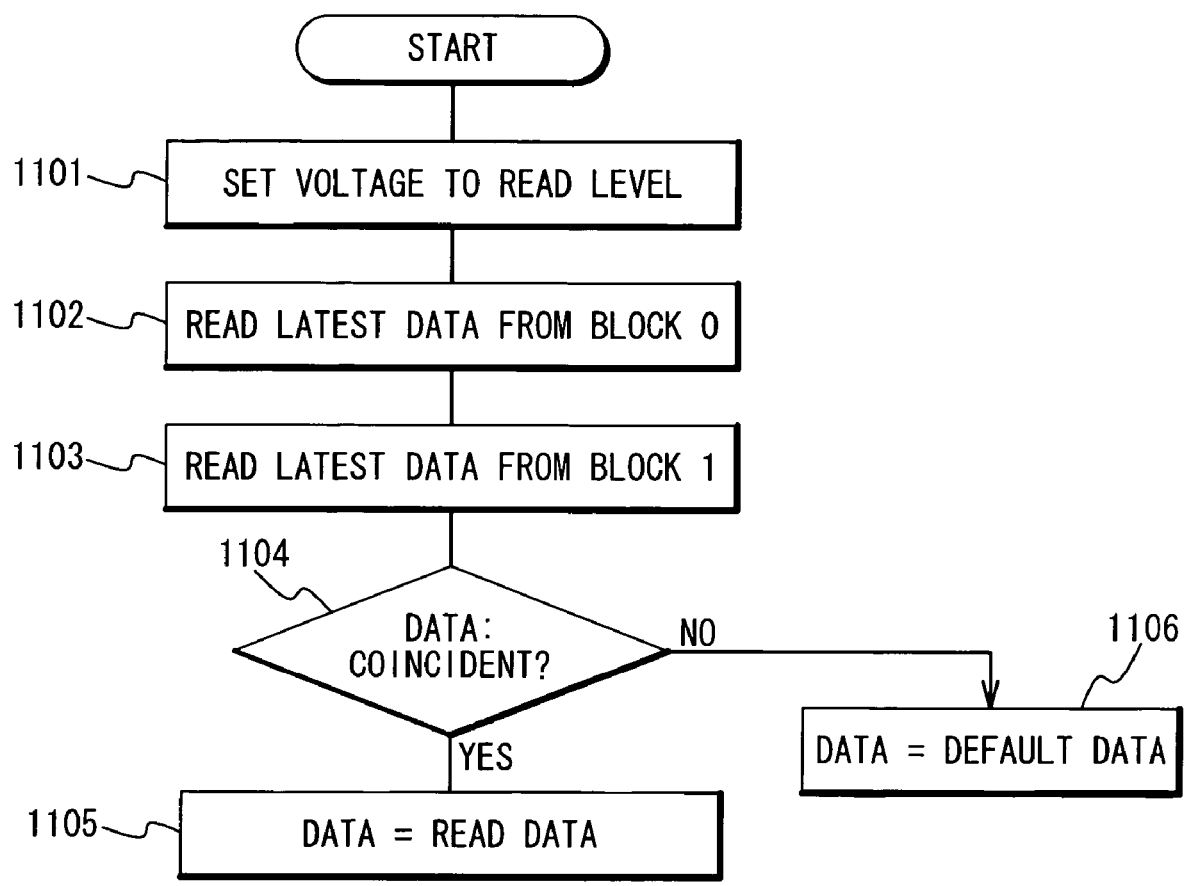

Next, when the data write command is outputted for the data area of the block (1) (step 505), data "d1" is written in the block (1) as shown in FIG. 6D-2 (step 506.

Subsequently, a value "00H" is written as the valid flag 10*a* of the block (1) to indicate that the data is valid, as shown in FIG. 6E-2 (step 507).

When the data is written as the valid flag 10*a* of the block (1), the value "00H" is written in the invalid flag 10*b* of the other block (0) to indicate that the data is invalid, as shown in FIGS. 6F-1 (step 508).

In FIG. 7, the steps 501 to 504 are a process when the data is written in the initial state shown in FIGS. 6A-1 and 6A-2, and the process subsequent to the step 505 is repeated in the subsequent processes. That is, after the data is written in one block and the valid flag 10*a* is set, the invalid flag 10*b* of the other block is set. By repeating the process, the data rewriting process is carried out. The rewritten data area is shown by meshes in FIGS. 6A-1 to 6K-2.

As shown in FIGS. 6F-1 and 6F-2, and 6K-1 and 6K-2, when the data written in the block is erased, the initial value "FFH" is written in the data areas, the valid flag area for the valid flags 10*a* and the invalid flag area for the invalid flags 10*b*. Same data is written in two blocks in the above conventional flash memory. However, in the flash memory 10 of the first embodiment, the data to be written in two blocks are individual data and may be the same or different data.

Next, the determining process of a valid data area (valid data) in the data reading process from the flash memory 10 will be described with reference to FIG. 8. This process is carried out by the CPU 20 based on the data access control program 100 shown in FIG. 3.

Figure 8:
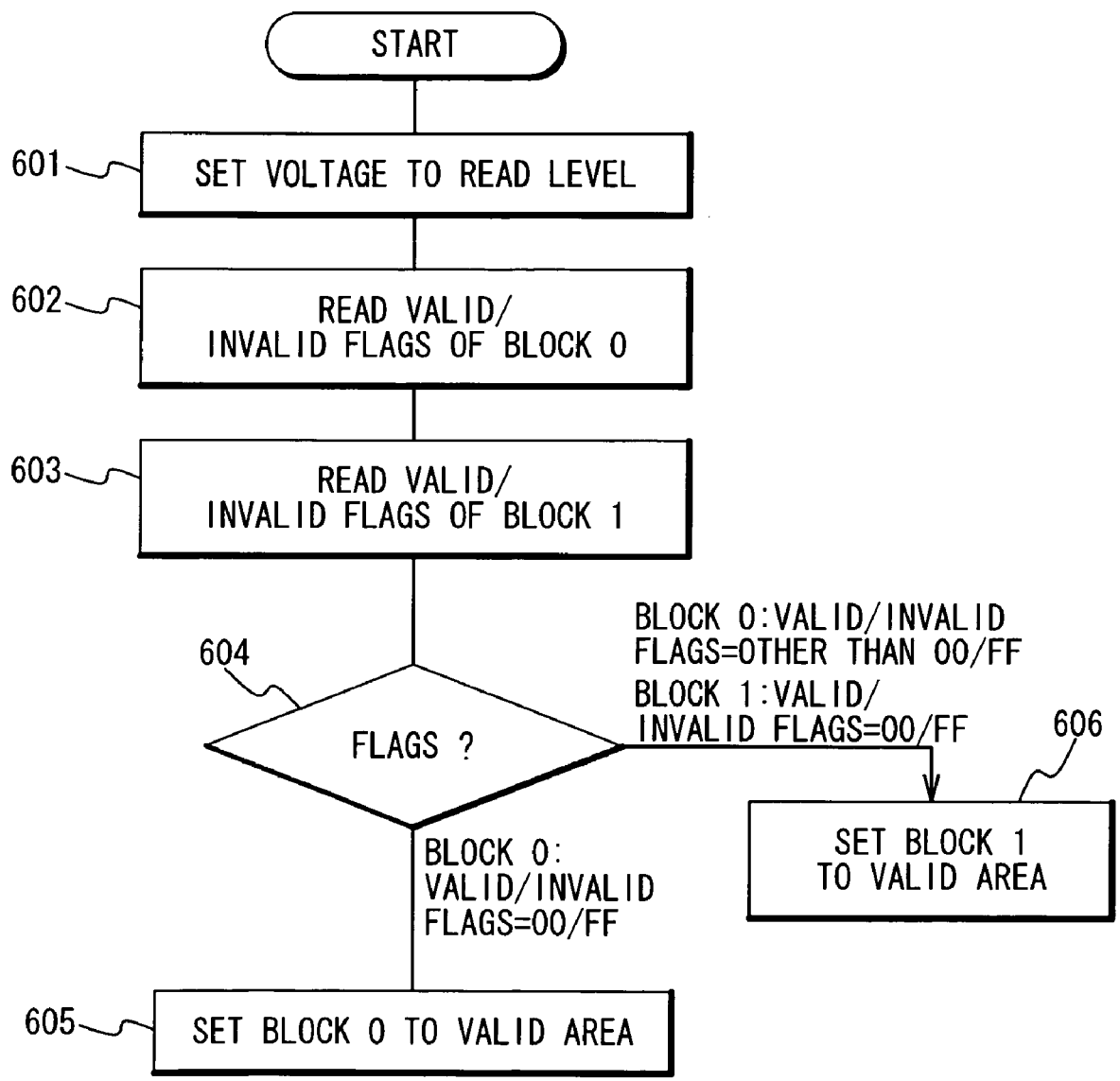
FIG. 8 is a flow chart showing a determining process of valid/invalid data in the flash memory according to the first embodiment of the present invention.

As shown in FIG. 8, firstly, a read voltage level is set (step 601).

Subsequently, the values of the valid flag 10*a* and invalid flag 10*b* are respectively read out from the blocks (0) and (1) by using the set read voltage level (steps 602 and 603). For example, as shown in FIGS. 6E-1 and 6E-2, the value "00H" of the valid flag 10*a* and the value "FFH" of the invalid flag 10*b* are read out from the block (0), and the value "00H" of the valid flag 10*a* and the value "FFH" of the invalid flag 10*b* are written in the block (1).

Subsequently, the determination based on the values of the read valid flag 10*a* and invalid flag 10*b* is carried out (step 604). When the value of the valid flag 10*a* is "00H" and the invalid flag 10*b* is "FFH" in the block (0), it is determined that the data area of the block (0) is valid regardless of the values of the valid flag 10*a* and the invalid flag 10*b* of the block (1) (step 605). That is, the data written in the data area of the block (0) is determined to be valid. Also, when the values of the valid flag 10*a* and invalid flag 10*b* of the block (0) are other than the combination of "00H" and "FFH", and the values of the valid flag 10*a* and invalid flag 10*b* of the block (1) are "00H" and "FFH", respectively, it is determined that the data area of the block (1) is valid (step 606). That is, the data written in the data area of the block (1) is determined to be valid.

In the first embodiment, as described above, the two blocks (0) and (1) of the flash memory 10 are used. When data is additionally written so that the block (0) becomes full, new data is written in the block (1). After the block (1) becomes full, the data erasing process of the block (0) is carried out for writing new data as shown in FIGS. 6G-1 to 6K-2. In this case, when the data rewriting process into a certain block is faulted due to some cause, e.g., power fault, or when the data erasing process of a certain block is carried out, a scheme is required for determining whether the data written in any of the blocks (0) and (1) is valid.

In the flash memory 10 in the first embodiment, the valid flag 10a and the invalid flag 10b are provided for each of the blocks (0) and (1), the valid data area is determined based on the procedures shown in FIG. 8. Therefore, which of the blocks is valid can be exactly be determined in any the above-mentioned cases.

Second Embodiment

In case that the data of the block (0) is erased at a timing t shown in FIGS. 6G-1 and 6G-2 after the invalid data is written as the invalid flag 10b of the block (0) as shown in shown in FIGS. 6F-1 and 6F-2, there would be a possibility that the block (0) is determined to be valid when the data rewriting process is interrupted due to the power fault. That is, there would be a case that it is determined that the value of the valid flag 10a of the block (0) is the value "00H" and the value of the invalid flag 10b thereof is "FFH". Such a state will be described by using FIGS. 10A to 10C and 11A to 11C.

FIGS. 10A to 10C and 11A to 11C show the voltage level of mode signals when the data writing process, the data reading process and the data erasing process of the flash memory 10 are carried out. For example, the erasure voltage level (EWV), the read voltage level (READ) and the write voltage level (WWV) are set to 2V, 4V and 6V, respectively.

The value "00H" is written as the valid flag 10a and the invalid flag 10b to indicate validity when the data writing process is normally carried out. In this case, as shown in FIGS. 10A to 10C, the valid flag 10a of "00H" has the voltage level higher than the write voltage level. Also, the invalid flag 10a of "FFH" has the voltage level lower than the erasure voltage level (EWV). In this state, if the valid flag 10a and invalid flag 10b of each block are read out based on the read voltage level (READ) as shown in FIG. 8, each value can be correctly read, and it can be determined that the valid flag 10a is "00H" and the invalid flag 10b is "FFH".

However, when the data rewriting process into the block (0) is interrupted due to the cause such as the power fault and is not normally completed as described above, there would be a possibility that the valid flag 10a of the block (0) is slightly higher than the read voltage level (READ), and the invalid flag 10b thereof is slightly lower than the read voltage level (READ) as shown by "o" of FIGS. 11A to 11C, although both the values of the valid flag 10a and invalid flag 10b of the block (0) should be originally set to "FFH" as the voltage levels shown by "X" in FIGS. 11A to 11C. In this case, if the valid flag 10a and invalid flag 10b of each block are read out based on the read voltage level (READ) in accordance with the procedures shown in FIG. 8, it is possibly determined that the valid flag 10a is "00H" and the invalid flag 10b is "FFH", resulting in an incorrect state.

In the second embodiment of the present invention, the occurrence of the above-mentioned incorrect state is eliminated, to make a correct determination possible. The hardware configuration of each block of the flash memory 10 in the second embodiment is the same as that of the first embodiment. In the second embodiment, the determining process of the valid flag (valid data) in the data reading process is different from that of the first embodiment.

The determining process of the valid area (valid data) in the data reading process from the flash memory 10 in the second embodiment will be described with reference to FIG. 9. This process is carried out under the control of the CPU 20 shown in FIG. 3.

As shown in FIG. 9, firstly, the read voltage level (READ) is set (step 701). Subsequently, the values of the valid flag 10a and invalid flag 10b are read out from each of the blocks (0) and (1) in the set read voltage level (steps 702, 703). Subsequently, the determination of the values of the read valid flag 10a and invalid flag 10b is carried out (step 704). When the values of the valid flag 10a and invalid flag 10b of the block (0) are "00H" and "FFH" in the determining process, and the values of the valid flag 10a and invalid flag 10b of the block (1) are except the combination of "00H" and "FFH", it is determined that the data area of the block (0) is valid (step 705). That is, the data written in the data area of the block (0) is valid.

When the values of the valid flag 10a and invalid flag 10b of the block (0) are except the combination of "00H" and "FFH", and the values of the valid flag 10a and invalid flag 10b of the block (1) are "00H" and "FFH", respectively, it is determined that the data area of the block (1) is valid (step 706). That is, the data written in the data area of the block (1) is valid.

When the values of the valid flag 10a and invalid flag 10b of each of the blocks (0) and (1) are "00H" and "FFH", there would be a possibility that the data rewriting process is interrupted without completion of the data rewriting process as described in the determination of the step 704, so that the voltage levels of the valid flag 10a and invalid flag 10b of the block (0) or (1) are not original voltage levels as shown in FIGS. 11A to 11C, resulting in the incorrect state that the flag values cannot be correctly read out. Therefore, in this case, the voltage level is set to the write voltage level (WWV) (step 707), and the values of the valid flag 10a and invalid flag 10b are again read out (steps 708 and 709). Then, the determining process is carried out to the read out valid flag 10a and invalid flag 10b (step 710).

In this determining process, like the step 704, when the values of the valid flag 10a and invalid flag 10b of the block (0) are "00H" and "FFH", and the values of the valid flag 10a and invalid flag 10b of the block (1) are other than the combination of "00H" and "FFH", it is determined that the data area of the block (0) is valid (step 705). When the values of the valid flag 10a and invalid flag 10b of the block (0) are other than the combination of "00H" and "FFH", and the values of the valid flag 10a and invalid flag 10b of the block (1) are "00H" and "FFH", respectively, it is determined that the data area of the block (1) is valid (step 706).

For example, when the data rewriting process is interrupted at the timing t shown in FIGS. 6F-1 and 6F-2, and the voltage levels of the valid flag 10a and invalid flag 10b of the block (0) are in the state shown by "X" in FIGS. 11A to 11C, and the voltage levels of the valid flag 10a and invalid flag 10b of the block (1) are in the state shown in FIGS. 10A to 10C, the value of each flag can be correctly read out, and the exact determination of the valid area can be realized, if the valid flag 10a and the invalid flag 10b are read out based on the above write voltage level (WWV).

It should be noted that in the determining process shown in FIG. 9, the case is shown that the determination is carried out by reading the valid flag and the invalid flag based on the write voltage level (WWV), after the read voltage level (READ). However, the determination may be carried out by reading the valid flag and the invalid flag based on the erase level (EWV).

According to the second embodiment, the determination of the valid area can be correctly accomplished based on not only the read voltage level (READ) but also the write voltage level (WWV) or the erase level (EWV) for the above incorrect state. The valid area can be more exactly determined by providing two or more read voltage levels for the determination of the valid area. That is, the data area storing the valid data can be correctly determined in a rare case where the read process of the valid flag and invalid flag in the block becomes incorrect in the usual read voltage level as the result of the rewrite interrupted due to the power fault or the like.

The present invention was described by way of the preferred embodiments. However, the present invention is not necessarily limited to the above embodiments. The present invention can be variously modified within scope of the technical idea.

In the above embodiment, it is supposed that the number of the data areas in the block of the flash memory 10 is one. However, the present invention can be similarly applied even when a plurality of data areas exist in each block. In this case, for example, the data area in which the latest data is written is determined to be valid.

As described above, in the data access control method in the flash memory of the present invention, even when the rewrite process is interrupted due to the power fault or the like in the rewrite process, the data area storing the valid data can be correctly determined.

Also, in a rare state that the read process of the valid flag and invalid flag in the block becomes incorrect in the usual read voltage level as the result of the rewrite process interrupted due to the power fault or the like, the data area storing the valid data can be correctly determined.

What is claimed is:

1. An access control method comprising:
   providing a flash memory, which comprises a set of a plurality of blocks, each of which has at least one data area and a flag area;
   referring to flag data written in said flag area of each of said plurality of blocks, to determine whether one of said plurality of blocks is valid;
   reading out data from said block when it is determined based on said flag data that said block is valid;
   wherein said flag area comprises a valid flag area and an invalid flag area separate from said valid flag area, and
   wherein the flash memory is initially written with valid data in at least one of a plurality of blocks,
   wherein said referring step comprises: reading out said flag data from said valid flag area and said invalid flag area in each of said plurality of blocks; and carrying out a first determination of whether said block is valid, based on said read out flag data from said valid and invalid flag areas in each of said plurality of blocks;
   setting a voltage for said flash memory to a read voltage level before said step of reading out said data from said valid and invalid flag areas;
   setting the voltage for said flash memory to a write voltage level, when said valid data is written in said valid flag area of said first block and said invalid data is not written in said invalid flag area of said first block and when said valid data is written in said valid flag area of said second block and said invalid data is not written in said invalid flag area of said second block;
   reading out said flag data from said valid and invalid flag areas in each of said plurality of blocks, after said step of setting the voltage for said flash memory to the write voltage level; and
   carrying out a second determination of whether said first block or said second block is valid, based on said read out flag data from said valid and invalid flag areas in each of said plurality of blocks.

2. The access control method according to claim 1, wherein said plurality of blocks are first and second blocks, and
   said step of carrying out a first determination comprises:
   determining that said first block is valid when valid data as said flag data is written in said valid flag area of said first block or invalid data as said flag data is not written in said invalid flag area of said first block; and
   determining that said second block is valid when said valid data is written in said valid flag area of said second block and said invalid data is not written in said invalid flag area of said second block.

3. The access control method according to claim 1, wherein said plurality of blocks are first and second blocks, and
   said step of carrying out a first determination comprises:
   determining that said first block is valid when valid data as said flag data is written in said valid flag area of said first block and invalid data as said flag data is not written in said invalid flag area of said first block and when said valid data is not written in said valid flag area of said second block or said invalid data is written in said invalid flag area of said second block; and
   determining that said second block is valid when said valid data is not written in said valid flag area of said first block, or said invalid data is written in said invalid flag area of said first block and when said valid data is written in said valid flag area of said second block and said invalid data is written in said invalid flag area of said second block.

4. The access control method according to claim 1, wherein said step of carrying out a second determination comprises:
   determining that said first block is valid when said valid data is written in said valid flag area of said first block and said invalid data is not written in said invalid flag area of said first block and when said valid data is not written in said valid flag area of said second block or said invalid data is written in said invalid flag area of said second block; and
   determining that said second block is valid when said valid data is not written in said valid flag area of said first block or said invalid data is written in said invalid flag area of said first block and when said valid data is written in said valid flag area of said second block and said invalid data is written in said invalid flag area of said second block.

5. The access control method according to claim 1, further comprising:
   writing said data in said block;
   writing said valid data as said flag data in said valid flag area of said block; and
   writing invalid data as said flag data in said invalid flag area of each of said plurality of blocks other than said block.

6. A computer system comprising:
   a flash memory which comprises a plurality of blocks and a program area, each of said plurality of blocks comprising at least one data area configured to store data, a valid flag area configured to store valid data as flag data and an invalid flag area configured to store invalid data as said flag data, the valid flag area separate from said invalid flag area, and said program area configured to store an access control program;
   a RAM section; and
   a CPU configured to read out said access control program from said flash memory, to store said access control program in said RAM section, and to execute said access control program,
   wherein based on said access control program in response to a read request, said CPU refers to said flag data in said valid and invalid flag areas of each of said plurality of blocks, to determine whether one of said plurality of blocks is valid, and reads out said data from said block when it is determined based on said flag data that said block is valid, and wherein the flash memory is initially written with valid data in at least one of a plurality of blocks, wherein said CPU reads out said flag data from said valid flag area and said invalid flag area in each of said plurality of blocks, and carries out a first determination of whether said block is valid, based on said read out flag data from said valid and invalid flag areas in each of said plurality of blocks, wherein said flash memory further comprises a control macro section, and said CPU controls said control macro section to set a voltage for said flash memory to a read voltage level before said step of reading out said data from said valid and invalid flag areas, wherein said flash memory further comprises a control macro section, and said CPU controls said control macro section to set the voltage for said flash memory to a write voltage level, when said valid data is written in said valid flag area of said first block and said invalid data is not written in said invalid flag area of said first block and when said valid data is written in said valid flag area of said second block and said invalid data is not written in said invalid flag area of said second block, said CPU reads out said flag data from said valid and invalid flag areas in each of said plurality of blocks, after said step of setting the voltage for said flash memory to the write voltage level, and carries out a second determination of whether said first block or said second block is valid, based on said read out flag data from said valid and invalid flag areas in each of said plurality of blocks.

7. The computer system according to claim 6, wherein said plurality of blocks are first and second blocks, and as the first determination, said CPU determines that said first block is valid when valid data as said flag data is written in said valid flag area of said first block or invalid data as said flag data is not written in said invalid flag area of said first block, and determines that said second block is valid when said valid data is written in said valid flag area of said second block and said invalid data is not written in said invalid flag area of said second block.

8. The computer system according to claim 6, wherein said plurality of blocks are first and second blocks, and as the first determination, said CPU determines that said first block is valid when valid data as said flag data is written in said valid flag area of said first block and invalid data as said flag data is not written in said invalid flag area of said first block and when said valid data is not written in said valid flag area of said second block or said invalid data is written in said invalid flag area of said second block, and determines that said second block is valid when said valid data is not written in said valid flag area of said first block or said invalid data is written in said invalid flag area of said first block and when said valid data is written in said valid flag area of said second block and said invalid data is written in said invalid flag area of said second block.

9. The computer system according to claim 6, wherein as the second determination, said CPU determines that said first block is valid when said valid data is written in said valid flag area of said first block and said invalid data is not written in said invalid flag area of said first block and when said valid data is not written in said valid flag area of said second block or said invalid data is written in said invalid flag area of said second block, and determines that said second block is valid when said valid data is not written in said valid flag area of said first block or said invalid data is written in said invalid flag area of said first block and when said valid data is written in said valid flag area of said second block and said invalid data is written in said invalid flag area of said second block.

10. The computer system according to claim 6, wherein said CPU writes said data in said block, writes said valid data as said flag data in said valid flag area of said block, and writing invalid data as said flag data in said invalid flag area of each of said plurality of blocks other than said block.

11. A flash memory storing a computer executable software product for realizing the functions of:

referring to flag data written in a flag area of each of said plurality of blocks to determine whether one of a plurality of blocks is valid, wherein a flash memory, which comprises a set of said plurality of blocks, each of which has at least one data area and said flag area; and reading out data from said block when it is determined based on said flag data that said block is valid, wherein said flag area comprises a valid flag area and an invalid flag area separate from said valid flag area, and wherein the flash memory is initially written with valid data in at least one of a plurality of blocks, said function of referring comprises the functions of:

reading out said flag data from said valid flag area and said invalid flag area in each of said plurality of blocks; and carrying out a first determination of whether said block is valid, based on said read out flag data from said valid and invalid flag areas in each of said plurality of blocks, setting a voltage for said flash memory to a read voltage level before reading out said data from said valid and invalid flag areas;

setting the voltage for said flash memory to a write voltage level, when said valid data is written in said valid flag area of said first block and said invalid data is not written in said invalid flag area of said first block and when said valid data is written in said valid flag area of said second block and said invalid data is not written in said invalid flag area of said second block;

reading out said flag data from said valid and invalid flag areas in each of said plurality of blocks, after said step of setting the voltage for said flash memory to the write voltage level;

determining that said first block is valid when said valid data is written in said valid flag area of said first block and said invalid data is not written in said invalid flag area of said first block and when said valid data is not written in said valid flag area of said second block or said invalid data is written in said invalid flag area of said second block; and determining that said second block is valid when said valid data is not written in said valid flag area of said first block or said invalid data is written in said invalid flag area of said first block and when said valid data is written in said valid flag area of said second block and said invalid data is written in said invalid flag area of said second block.

12. The flash memory according to claim 11, wherein said plurality of blocks are first and second blocks, and said function of carrying out a first determination comprises:

determining that said first block is valid when valid data as said flag data is written in said valid flag area of said first block and invalid data as said flag data is not written in said invalid flag area of said first block and when said valid data is not written in said valid flag area of said second block or said invalid data is written in said invalid flag area of said second block; and determining that said second block is valid when said valid data is not written in said valid flag area of said first block or said invalid data is written in said invalid flag area of said first block and when said valid data is written in said valid flag area of said second block and said invalid data is written in said invalid flag area of said second block, 13. The flash memory according to claim 11, further comprising the functions of:

writing said data in said block;

writing said valid data as said flag data in said valid flag area of said block; and writing invalid data as said flag data in said invalid flag area of each of said plurality of blocks other than said block.

14. An access control method of a flash memory, comprising:

reading a valid flag data and an invalid flag data from a valid flag region and an invalid flag region in each of a plurality of blocks, respectively, the valid flag region separate from said invalid flag region;

wherein each of said plurality of blocks of said flash memory has a data region storing a data, and a flag region provided for said data region;

wherein said flag region has said valid flag region storing the valid flag data indicating whether said data region is valid, and said invalid flag region storing the invalid flag data indicating whether said data region is invalid;

specifying blocks storing the valid flag data indicating that said data region is valid and the invalid flag data indicating that said data region is not invalid, based on a read result;

additionally writing the data in said data region of any specific block of said plurality of blocks other than the specified blocks;

writing the valid flag data in said valid flag region of said specific block, to indicate that said data region of said specific block is valid; and writing the invalid, flag data in said invalid flag region of said specific block to indicate that said data region of said specific block is valid, wherein said reading is carried out in a first voltage level and then a second voltage level different from the first voltage level.

15. An access control method of a flash memory, comprising:

reading a valid flag data and an invalid flag data from a valid flag region and an invalid flag region in each of a plurality of blocks, respectively;

wherein each of said plurality of blocks of said flash memory has a data region storing a data, and a flag region provided for said data region;

wherein said flag region has said valid flag region storing the valid flag data indicating whether said data region is valid, and said invalid flag region storing the invalid flag data indicating whether said data region is invalid;

specifying blocks storing the valid flag data indicating that said data region is valid and the invalid flag data indicating that said data region is not invalid, based on a read result;

additionally writing the data in said data region of any specific block of said plurality of blocks other than the specified blocks;

writing the valid flag data in said valid flag region of said specific block, to indicate that said data region of said specific block is valid; and writing the invalid flag data in said invalid flag region of said specific block to indicate that said data region of said specific block is valid, wherein said reading comprises:

reading the valid flag data and the invalid flag data from said valid flag region and said invalid flag region in each of said plurality of blocks, in a first voltage level, respectively;

confirming whether there are plural blocks in which both of the valid flag data indicating that said data region is valid and the invalid flag data indicating that said data region is not invalid are stored, based on the reading result in the first voltage level; and when there are said plural blocks, reading the valid flag data and the invalid flag data from said valid flag region and said invalid flag region in each of said plural blocks in a second voltage level different from the first voltage level.

* * * * *